US009625281B2

United States Patent
Bilger et al.

(10) Patent No.: US 9,625,281 B2
(45) Date of Patent: Apr. 18, 2017

(54) FAIL-SAFE OPERATION OF AN ANGLE SENSOR WITH MIXED BRIDGES HAVING SEPARATE POWER SUPPLIES

(71) Applicant: Infineon Technologies AG, Neubiberg (DE)

(72) Inventors: Christoph Bilger, Munich (DE); Konrad Kapser, Graefelfing (DE)

(73) Assignee: Infineon Technologies AG, Neubiberg (DE)

(*) Notice: Subject to any disclaimer, the term of this patent is extended or adjusted under 35 U.S.C. 154(b) by 134 days.

(21) Appl. No.: 14/580,862

(22) Filed: Dec. 23, 2014

(65) Prior Publication Data

US 2016/0178403 A1 Jun. 23, 2016

(51) Int. Cl.
| | | |
|---|---|---|
| *G01D 5/244* | (2006.01) | |
| *G01R 33/09* | (2006.01) | |
| *G01B 7/30* | (2006.01) | |
| *G01D 5/16* | (2006.01) | |
| *G01D 5/14* | (2006.01) | |

(52) U.S. Cl.
CPC ............ *G01D 5/24461* (2013.01); *G01B 7/30* (2013.01); *G01D 5/145* (2013.01); *G01D 5/16* (2013.01); *G01D 5/244* (2013.01); *G01R 33/09* (2013.01); *G01R 33/093* (2013.01)

(58) Field of Classification Search
CPC .......... G01D 5/244; G01D 5/16; G01D 5/145; G01B 7/30; G01R 33/09; G01R 33/093
USPC .................................................... 324/207.21
See application file for complete search history.

(56) References Cited

U.S. PATENT DOCUMENTS

| | | | | | |
|---|---|---|---|---|---|
| 5,574,364 | A | * | 11/1996 | Kajimoto | F02D 41/009 324/207.12 |
| 6,674,280 | B1 | * | 1/2004 | Goetz | G01B 7/003 324/207.12 |
| 6,882,145 | B2 | * | 4/2005 | Ehresmann | B82Y 25/00 324/207.21 |
| 6,927,566 | B2 | * | 8/2005 | Apel | G01D 5/145 324/174 |
| 7,141,967 | B2 | | 11/2006 | Butzmann | |
| 7,312,609 | B2 | * | 12/2007 | Schmollngruber | .... B82Y 25/00 324/207.21 |
| 7,400,143 | B2 | * | 7/2008 | Hayashi | B82Y 25/00 324/207.21 |
| 8,054,067 | B2 | * | 11/2011 | Okada | B82Y 25/00 324/207.21 |

(Continued)

OTHER PUBLICATIONS

NVE Corporation, "GMR Sensor Catalog," http://www.nve.com/Downloads/catalog.pdf, Oct. 16, 2012, 145 pages.

(Continued)

*Primary Examiner* — Jermele M Hollington
*Assistant Examiner* — Christopher McAndrew
(74) *Attorney, Agent, or Firm* — Harrity & Harrity, LLP (57) ABSTRACT

A magnetic angle sensor may include a first bridge circuit. The first bridge circuit may include a first half-bridge to generate a first signal indicative of a first angular component of a direction of a magnetic field. The first bridge circuit may include a second half-bridge to generate a second signal indicative of a second angular component of the direction of the magnetic field. The second angular component may be linearly independent from the first angular component.

20 Claims, 9 Drawing Sheets

(56) References Cited

U.S. PATENT DOCUMENTS

| | | | |
|---|---|---|---|
| 8,093,886 B2* | 1/2012 | Okada | G01D 5/145 324/207.12 |
| 8,798,958 B2 | 8/2014 | Satou et al. | |
| 2003/0222642 A1* | 12/2003 | Butzmann | G01D 5/147 324/207.21 |
| 2004/0189285 A1* | 9/2004 | Uenoyama | G01D 5/147 324/207.12 |
| 2004/0257069 A1* | 12/2004 | Butzmann | G01P 3/488 324/207.21 |
| 2006/0103381 A1* | 5/2006 | Schmollngruber | B82Y 25/00 324/252 |
| 2006/0238068 A1* | 10/2006 | May | B06B 1/0246 310/314 |
| 2008/0258716 A1* | 10/2008 | Hinz | G01D 5/145 324/207.21 |
| 2009/0206827 A1* | 8/2009 | Aimuta | G01D 5/145 324/207.25 |
| 2012/0116717 A1 | 5/2012 | Satou et al. | |
| 2013/0264915 A1* | 10/2013 | Suzuki | B62D 5/0484 310/68 B |
| 2013/0265095 A1* | 10/2013 | Mazzola | H02M 1/08 327/379 |
| 2013/0335070 A1 | 12/2013 | Abe et al. | |
| 2013/0335073 A1 | 12/2013 | Deak et al. | |
| 2015/0219472 A1* | 8/2015 | Ausserlechner | G01D 5/145 324/207.25 |

OTHER PUBLICATIONS

NXP Semiconductors, "KMA210 Programmable angle sensor," http://www.nxp.com/documents/data_sheet/KMA210.pdf, Dec. 7, 2011, 37 pages.

Infineon Technologies, "Giant Magneto Resistors," http://www.fer.unizg.hr/_download/repository/ST10-InfineonGMR.pdf, Jul. 2001, 19 pages.

* cited by examiner

FAIL-SAFE OPERATION OF AN ANGLE SENSOR WITH MIXED BRIDGES HAVING SEPARATE POWER SUPPLIES

BACKGROUND

A magnetic angle sensor may be used to determine the absolute orientation of a magnetic field (e.g., between 0 degrees and 360 degrees). A magnetic angle sensor may use giant magnetoresistance (GMR) technology, anisotropic magnetoresistance (AMR) technology, tunnel magnetoresistance (TMR) technology, or the like. Magnetic angle sensors may be used, for example, in power steering, magnetic encoding, motor commutation, rotational position measurement, or the like.

SUMMARY

According to some possible implementations, a magnetic angle sensor may comprise a first bridge circuit. The first bridge circuit may comprise a first half-bridge to generate a first signal indicative of a first angular component of a direction of a magnetic field. The first bridge circuit may comprise a second half-bridge to generate a second signal indicative of a second angular component of the direction of the magnetic field. The second angular component may be linearly independent from the first angular component.

Additionally, or alternatively, the first angular component may correspond to a cosine-related component, and the second angular component may be substantially orthogonal to the first angular component. Additionally, or alternatively, the magnetic angle sensor may include a second bridge circuit, wherein the first bridge circuit and the second bridge circuit are formed on one chip.

According to some possible implementations, a magnetic angle sensor may comprise a first bridge circuit that includes a first half-bridge and a second half-bridge, wherein the first half-bridge provides a signal indicative of a first angular component of a direction of a magnetic field. The magnetic angle sensor may comprise a second bridge circuit that includes a third half-bridge and a fourth half-bridge, wherein the third half-bridge provides a signal indicative of a second angular component anti-parallel to the first angular component.

Additionally, or alternatively, the first bridge circuit and the second bridge circuit may be formed on one chip. Additionally, or alternatively, the first half-bridge may comprises a first resistor and a second resistor, wherein the first resistor and the second resistor have opposite first magnetic reference directions. Additionally, or alternatively, the second half-bridge may comprise a third resistor and a fourth resistor, wherein the third resistor and the fourth resistor have opposite second magnetic reference directions that are substantially perpendicular to the first magnetic reference directions.

Additionally, or alternatively, the third half-bridge may comprise a fifth resistor and a sixth resistor, wherein the fifth resistor and the sixth resistor have opposite third magnetic reference directions. Additionally, or alternatively, the fourth half-bridge may comprise a seventh resistor and an eighth resistor, wherein the seventh resistor and the eighth resistor having opposite fourth magnetic reference directions that are substantially perpendicular to the third magnetic reference directions. Additionally, or alternatively, the first half-bridge may be configured to generate a sine-related signal, and the second half-bridge may be configured to generate a cosine-related signal.

According to some possible implementations, a sensing component may comprise a first half-bridge that includes a first magnetoresistor having a first magnetic reference direction and a second magnetoresistor having a second magnetic reference direction. The second magnetic reference direction may be different from the first magnetic reference direction. The sensing component may comprise a second half-bridge that includes a third magnetoresistor having a third magnetic reference direction. The third magnetic reference direction may be different from the first magnetic reference direction and the second magnetic reference direction. The sensing component may comprise a fourth magnetoresistor having a fourth magnetic reference direction. The fourth magnetic reference direction may be different from the first magnetic reference direction, the second magnetic reference direction, and the third magnetic reference direction.

Additionally, or alternatively, the first magnetic reference direction may be substantially perpendicular to the third magnetic reference direction and the fourth magnetic reference direction. Additionally, or alternatively, the second magnetic reference direction may be substantially perpendicular to the third magnetic reference direction and the fourth magnetic reference direction. Additionally, or alternatively, the first half-bridge may be configured to generate a sine signal or a phase-inverted sine signal, and the second half-bridge may be configured to generate a cosine signal or a phase-inverted cosine signal.

Additionally, or alternatively, the sensing component may be included in a magnetic angle sensor, wherein the first half-bridge is configured to generate a first output signal, wherein the second half-bridge is configured to generate a second output signal, and wherein the magnetic angle sensor is configured to determine a direction of an external magnetic field applied to the magnetic angle sensor based on the first output signal and the second output signal.

Additionally, or alternatively, the first half-bridge may be configured to generate a sine signal, and the second half-bridge may be configured to generate a cosine signal. Additionally, or alternatively, the first half-bridge may be configured to generate a sine signal, and the second half-bridge may be configured to generate a phase-inverted cosine signal. Additionally, or alternatively, the first half-bridge may be configured to generate a phase-inverted sine signal, and the second half-bridge may be configured to generate a cosine signal. Additionally, or alternatively, the first half-bridge may be configured to generate a phase-inverted sine signal, and the second half-bridge may be configured to generate a phase-inverted cosine signal.

According to some possible implementations, an apparatus may comprise a first bridge circuit configured to receive power from a first power supply. The first bridge circuit may comprise a first half-bridge that includes a first resistor and a second resistor having a first magnetic reference direction and a second magnetic reference direction, respectively, and a second half-bridge that includes a third resistor and a fourth resistor having a third magnetic reference direction and a fourth magnetic reference direction, respectively, that are substantially perpendicular to the first magnetic reference direction and the second magnetic reference direction. The apparatus may comprise a second bridge circuit configured to receive power from a second power supply that is different from the first power supply. The second bridge circuit may comprise a third half-bridge that includes a fifth resistor and a sixth resistor having a fifth magnetic reference direction and a sixth magnetic reference direction, respectively, and a fourth half-bridge that includes a seventh resistor and an eighth resistor having a seventh magnetic reference direction and an eighth magnetic reference direction, respectively, that are substantially perpendicular to the fifth magnetic reference direction and the sixth magnetic reference direction.

Additionally, or alternatively, a first pair of anti-parallel magnetic reference directions is formed by at least two of the second magnetic reference direction, the fourth magnetic reference direction, the sixth magnetic reference direction, or the eighth magnetic reference direction. A second pair of anti-parallel magnetic reference directions, being substantially perpendicular to the first pair of anti-parallel magnetic reference directions, may be formed by at least two others of the second magnetic reference direction, the fourth magnetic reference direction, the sixth magnetic reference direction, or the eighth magnetic reference direction.

Additionally, or alternatively, the first half-bridge may be configured to generate a first output signal, wherein the first output signal is a sine signal or a phase-inverted sine signal, and the second half-bridge may be configured to generate a second output signal, wherein the second output signal is a cosine signal or a phase-inverted cosine signal. The apparatus may be configured to calculate a direction of a magnetic field based on the first output signal and the second output signal.

DETAILED DESCRIPTION

The following detailed description of example implementations refers to the accompanying drawings. The same reference numbers in different drawings may identify the same or similar elements.

A magnetic angle sensor may be used to determine a direction of a magnetic field applied to the magnetic angle sensor (e.g., an angle of the magnetic field with respect to a reference direction). By attaching a magnet to an object that moves (e.g., linearly, rotationally, etc.), the magnetic angle sensor may be used to determine a position of the object (e.g., a linear position, an angle of rotation, etc.). The magnetic angle sensor may provide information regarding the position to a controller, which may control another component based on the position. For example, the magnetic angle sensor may be used to determine the angle of rotation of a steering wheel to assist with electric power steering. The controller may control a steering system based on the angle of rotation of the steering wheel.

In electric power steering and other safety-critical systems, it is important to determine when a magnetic angle sensor fails, and/or to permit a control system to continue to operate despite a failure in the magnetic angle sensor. In such systems, the controller may determine whether a signal, received from a magnetic angle sensor, is valid. The controller may make this validity determination by receiving independent signals from independent magnetic angle sensors. If the independent signals have the same value (or a similar value, within a threshold), then the controller may determine that the signals are valid. If the independent signals have different values, then the controller may determine that one or both of the magnetic angle sensors has malfunctioned. In this case, the controller may instruct the system to enter a safe state, which may shut down the system or reduce system performance.

To prevent the controller from shutting down the system or reducing system performance, additional magnetic angle sensors may be used to provide redundancy and increase the chances that the controller receives a valid signal. However, adding additional magnetic angle sensors to the system increases a cost of the system, a size of the system, a weight of the system, etc. Implementations described herein permit a single magnetic angle sensor to provide redundancy for a control system by using two bridge circuits with different magnetic reference directions, as described in more detail below.

Figure 1A:
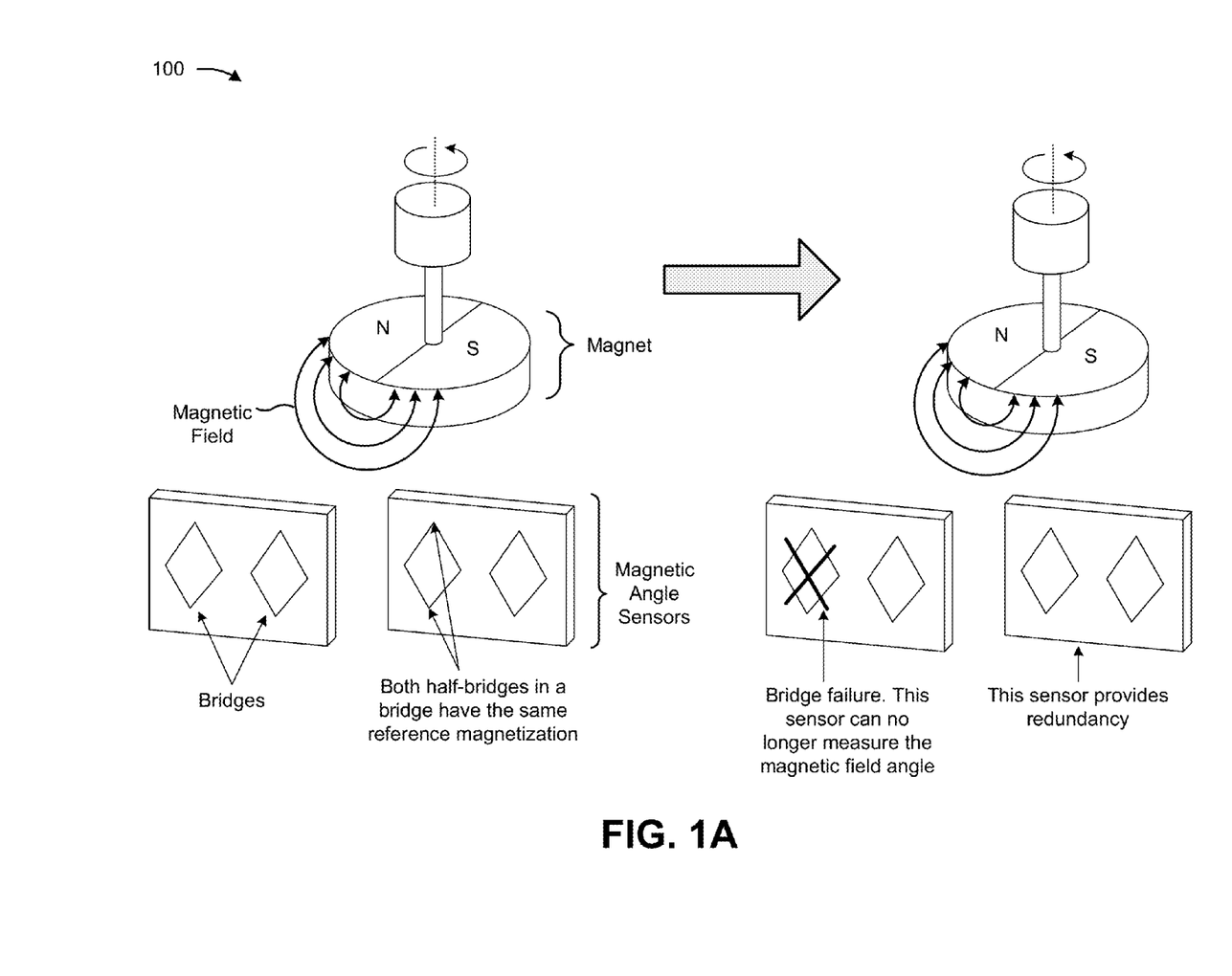
FIGS. 1A and 1B are diagrams of an overview of an example implementation described herein.

FIGS. 1A and 1B are diagrams of an overview of an example implementation 100 described herein. As shown in FIG. 1A, assume that a system includes a magnet, such as a dipole magnet, which may be attached to a moving object. As shown in example implementation 100, assume that the object is a rotating object. As further shown, the system may also include magnetic angle sensors, which may be used to measure a direction (e.g., an angle) of a magnetic field generated by the magnet. A magnetic angle sensor may include multiple bridge circuits (shown as "bridges"). A bridge circuit may include two circuit branches, or half-bridges. As shown, some bridges may include two half-bridges with resistors that use the same magnetic reference direction to assist with measuring the magnetic field angle generated by the magnet. However, in this configuration, when one bridge fails, a magnetic angle sensor, that includes the bridge, can no longer measure the magnetic field angle. In this case, the system may include another magnetic angle sensor to provide redundancy in case of a failure in a bridge of the other magnetic angle sensor, as shown.

Figure 1B:
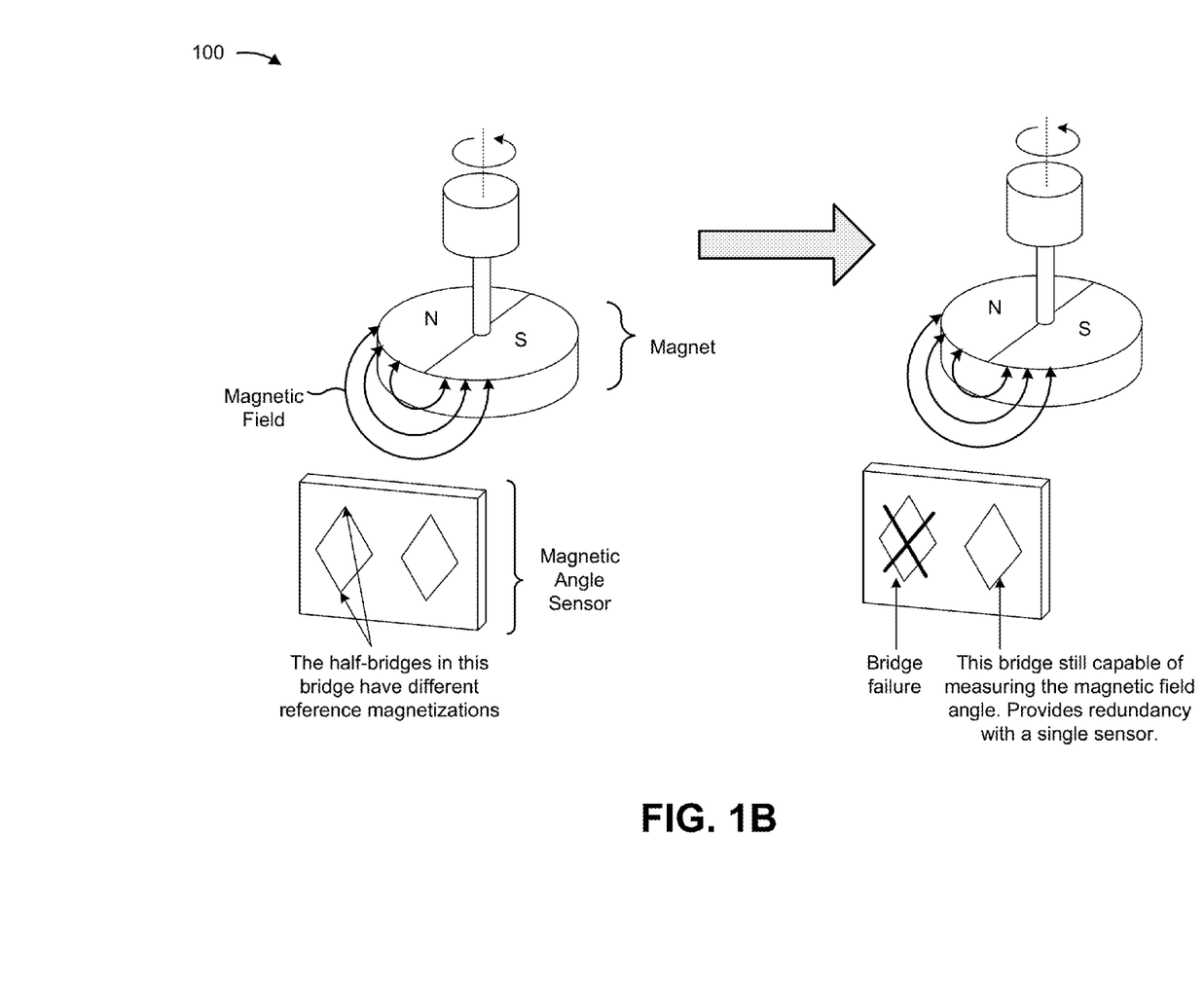

As shown in FIG. 1B, assume that a magnetic angle sensor includes a bridge with two half-bridges with resistors that use different magnetic reference directions to assist with measuring the magnetic field angle generated by the magnet. In this configuration, a single bridge may be capable of measuring the magnetic field angle. Thus, when one bridge fails, another bridge, included in the magnetic angle sensor, is still capable of measuring the magnetic field angle. In this way, a single magnetic angle sensor may be used to measure the magnetic field angle generated by a magnet, thereby reducing a cost, size, weight, etc. of the system. When both bridges of the magnetic angle sensor are working, the magnetic angle sensor may have better accuracy performance than the case where one of the bridges fails. However, in the case where one of the bridges fails, the magnetic angle sensor will still be able to measure the magnetic field angle, and the system will remain operable.

Figure 2A:
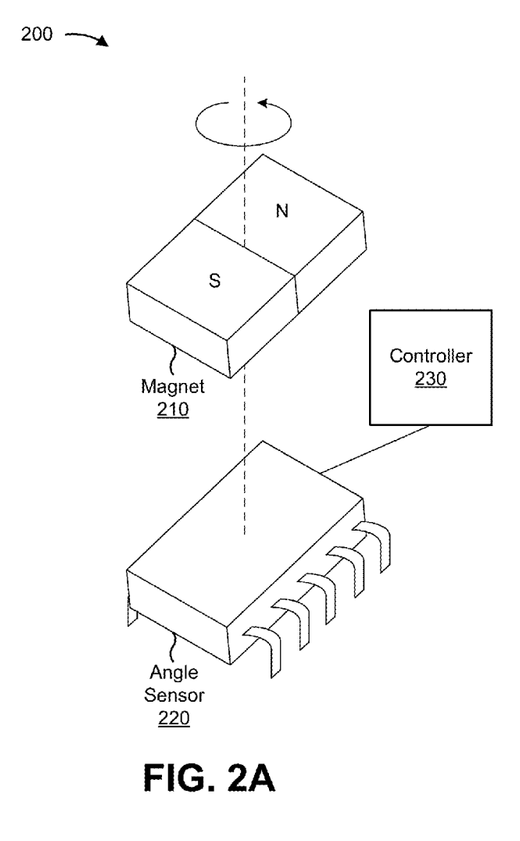
FIGS. 2A and 2B are diagrams of an example environment in which systems and/or methods, described herein, may be implemented.
Figure 2B:
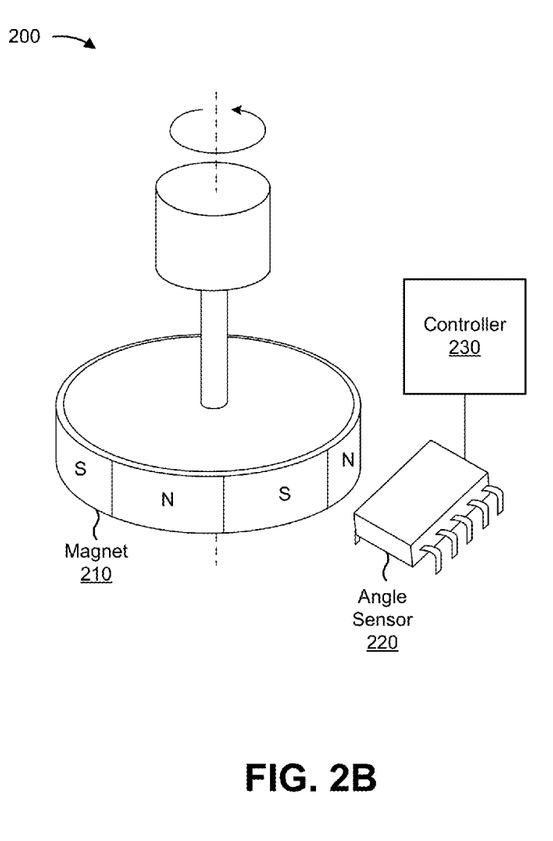

FIGS. 2A and 2B are diagrams of an example environment 200 in which systems and/or methods, described herein, may be implemented. As shown in FIGS. 2A and 2B, environment 200 may include a magnet 210, an angle sensor 220, and/or a controller 230. Devices of environment 200 may interconnect via wired connections, wireless connections, or a combination of wired and wireless connections.

Magnet 210 may include one or more magnets. In some implementations, magnet 210 may include a magnetic pole wheel (e.g., with at least two alternating poles, such as a north pole and a south pole), a dipole magnet (e.g., a dipole bar magnet, a circular dipole magnet, an elliptical dipole magnet, etc.), a permanent magnet, an electromagnet, a magnetic scale, a magnetic tape, or the like. For example, magnet 210 may include a dipole magnet, as shown in FIG. 2A, and/or may include a magnetic pole wheel, as shown in FIG. 2B. Magnet 210 may be comprised of a ferromagnetic material, and may produce a magnetic field. In some implementations, magnet 210 may be attached to or coupled with an object for which a position (e.g., a linear position, an angle of rotation) is to be measured, such as a wheel (e.g., a steering wheel), an axle (e.g., a vehicle axle), a cylindrical structure (e.g., a cylinder, a camshaft, a crankshaft, etc.), a linearly moving object (e.g., a movable hydraulic piston), or the like.

Angle sensor 220 may include one or more apparatuses for measuring a direction of a magnetic field (e.g., a magnetic field angle with respect to a reference direction). For example, angle sensor 220 may include one or more circuits (e.g., one or more integrated circuits). Additionally, or alternatively, angle sensor 220 may include a magnetic angle sensor, a magnetic position sensor, a magnetoresistive sensor, or the like. Angle sensor 220 may be positioned at a particular location relative to magnet 210, such that angle sensor 220 may detect a magnetic field generated by magnet 210. Angle sensor 220 may include one or more magnetoresistance sensors for measuring a strength, a direction (e.g., an angle), etc. of an external magnetic field applied to angle sensor 220 (e.g., by magnet 210). In some implementations, angle sensor 220 may use one or more bridges to assist with measuring a magnetic field angle, as described in more detail elsewhere herein. Angle sensor 220 may measure magnetoresistance based on an anisotropic magnetoresistance (AMR) effect, a giant magnetoresistance (GMR) effect, a tunnel magnetoresistance (TMR) effect, or the like.

Controller 230 may include one or more apparatuses for controlling a system. For example, controller 230 may include one or more circuits (e.g., an integrated circuit, a control circuit, a feedback circuit, etc.). Controller 230 may receive input from one or more sensors, such as angle sensor 220, may process the input (e.g., using an analog signal processor, a digital signal processor, etc.), and may provide output to control a system based on the input. For example, controller 230 may receive an input signal from angle sensor 220, and may use the input signal to generate an output signal to control a system. The controlled system may include, for example, a vehicle system, a steering system (e.g., to control steering of a vehicle based on detecting an angle of rotation of a steering wheel), a braking system, a motor system (e.g., a brushless motor system), or the like.

The number and arrangement of devices shown in FIGS. 2A and 2B are provided as an example. In practice, there may be additional devices, fewer devices, different devices, or differently arranged devices than those shown in FIGS. 2A and 2B. Furthermore, two or more devices shown in FIGS. 2A and 2B may be implemented within a single device, or a single device shown in FIGS. 2A and 2B may be implemented as multiple, distributed devices. Additionally, or alternatively, a set of devices (e.g., one or more devices) of environment 200 may perform one or more functions described as being performed by another set of devices of environment 200.

Figure 3:
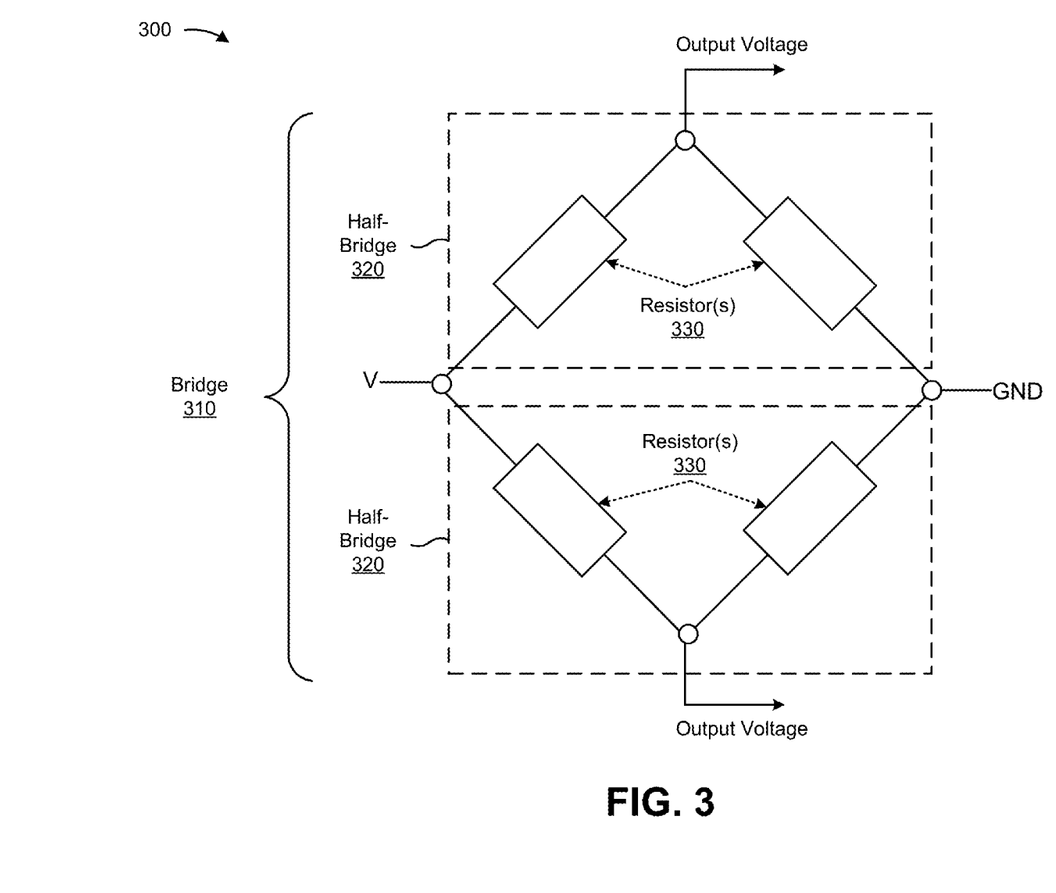
FIG. 3 is a diagram of an example sensing component of an angle sensor shown in FIGS. 2A and 2B.

FIG. 3 is a diagram of an example sensing component 300 of angle sensor 220 shown in FIGS. 2A and 2B. In some implementations, angle sensor 220 may include one or more sensing components 300 (e.g., magnetic angle sensing components) and/or one or more components of sensing component 300. In particular, angle sensor 220 may comprise, in some implementations, two or more sensing components 300 on one chip (e.g., on one circuit). As shown in FIG. 3, sensing component 300 may include one or more apparatuses, such as a bridge 310, which may include two half-bridges 320 (hereinafter referred to individually as "half-bridge 320," and collectively as "half-bridges 320"). Half-bridge 320 may include a set of resistors 330 (hereinafter referred to individually as "resistor 330," and collectively as "resistors 330"). For example, half-bridge 320 may include two resistors 330, as shown.

Bridge 310 may include one or more circuits that provide one or more output voltages based on a direction (e.g., an angle) of a magnetic field applied to bridge 310. For example, bridge 310 may include a Wheatstone bridge. As shown, bridge 310 may include two half-bridges 320 that are electrically coupled. Both half-bridges 320 may be coupled to a power supply, and may receive an input voltage signal (shown as V). As further shown, both half-bridges 320 may receive the input voltage signal V in relation to a reference voltage signal (e.g., a ground voltage signal, shown as GND).

As further shown, half-bridge 320 may include two resistors 330. Resistor 330 may include, for example, a magnetoresistive element (e.g., a magneto-resistor) with an electrical resistance that depends on a direction (e.g., an angle) of an external magnetic field applied to resistor 330. The direction of the magnetic field may form an angle with respect to a magnetic reference direction associated with resistor 330. One or more output voltages from bridge 310 may be used to calculate this angle (e.g., and the direction of the external magnetic field). In bridge 310, a first half-bridge 320 may generate a sine or a phase-inverted sine signal (e.g., as the output voltage of first half-bridge 320), and a second half-bridge 320 may generate a cosine or phase-inverted cosine signal (e.g., as the output voltage of second half-bridge 320). In this configuration, bridge 310 may be referred to as a mixed bridge, as described in more detail in connection with FIGS. 4A-4D. A mixed bridge, as used herein, may refer to an individual bridge, such as those depicted in FIGS. 4A-4D, that provides both a sine-related signal and a cosine-related signal at individual terminals of the bridge. The sine-related signal provided by the mixed bridge may be a sine signal or a phase-inverted sine signal (e.g., $\overline{\sin}$). Likewise, a cosine-related signal provided by the mixed bridge may be a cosine signal or a phase-inverted cosine signal (e.g., $\overline{\cos}$).

In some implementations, the sine signal, the phase-inverted sine signal, the cosine signal, and/or the phase-inverted cosine signal may be voltage signals. A phase-inverted signal may refer to a signal with an opposite sign and/or phase with respect to a reference signal. For example, a phase-inverted sine signal may have an opposite sign and/or phase than a sine signal, and a phase-inverted cosine signal may have an opposite sign and/or phase than a cosine signal.

The number and arrangement of components shown in FIG. 3 are provided as an example. In practice, sensing component 300 may include additional components, different components, or differently arranged components than those shown in FIG. 3. Additionally, or alternatively, a set of components (e.g., one or more components) of sensing component 300 may perform one or more functions described as being performed by another set of components of sensing component 300.

FIGS. 4A-4D are diagrams of example implementations 400 of sensing component 300 shown in FIG. 3. FIGS. 4A-4D show different examples of sensing components 300 with mixed bridges.

Figure 4A:
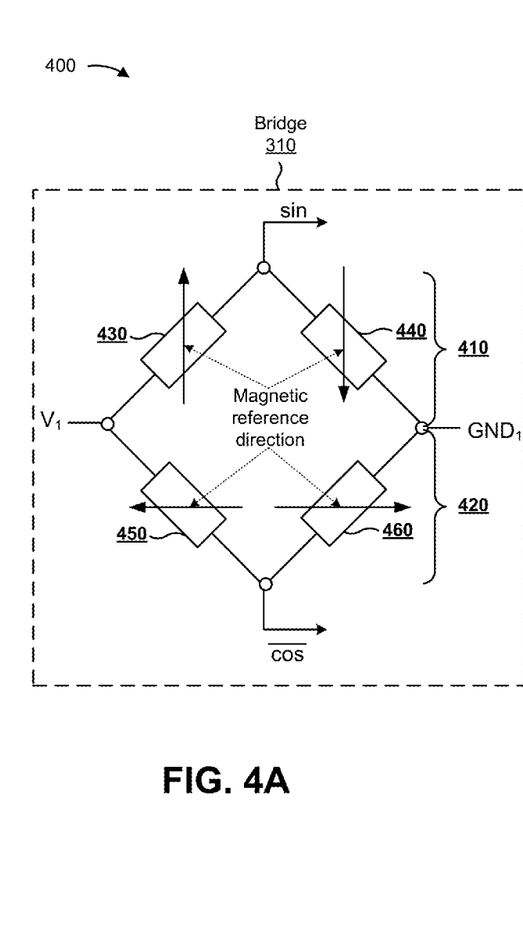
FIGS. 4A-4D are diagrams of example implementations of a sensing component shown in FIG. 3.

As shown in FIG. 4A, resistor 330 may have a magnetic reference direction. The magnetic reference direction may refer to an axis against which an angle of an applied magnetic field is measured. In some implementations, the magnetic reference direction of resistor 330 may be an easy magnetic axis of resistor 330. The easy magnetic axis may be a direction of magnetization, within resistor 330, that results in a lowest possible energy state (e.g., a spontaneous magnetization of a magnetoresistive material included in resistor 330). In other words, the easy magnetic axis may refer to an energetically favorable direction of spontaneous magnetization, which may be determined based on one or more magnetic anisotropy factors, such as an atomic structure of a magnetoresistive material, a shape anisotropy of the magnetoresistive material due to a shape of the magnetoresistive material, a magnetoelastic anisotropy due to tension in the magnetoresistive material, or the like.

In other words, sensing component 300 may include resistors 330 (e.g., resistive elements) sensitive to an external magnetic field. Each resistor 330 may have a magnetic reference direction. The magnetic reference direction may be based on a geometry of resistor 330 (e.g., in the case of the AMR effect), a magnetic reference layer of resistor 330 (e.g., in the case of the GMR effect, the TMR effect, etc.), or the like. The resistance of resistor 330 may change based on the direction of the external magnetic field applied to resistor 330.

As an example, the magnetic reference direction of resistor 330 may be determined based on a direction of a current flowing through resistor 330 (e.g., where resistor 330 is an anisotropic magnetoresistor using the AMR effect). As another example, the magnetic reference direction of resistor 330 may be determined based on a magnetoresistive material that comprises resistor 330 (e.g., where resistor 330 is a giant magnetoresistor using the GMR effect).

In some implementations, bridge 310 may include a mixed bridge with a first half-bridge 410 and a second half-bridge 420, which may correspond to half-bridge 320, described above. First half-bridge 410 may include a first resistor 430 and a second resistor 440, which may correspond to resistor 330, described above. Second half-bridge 420 may include a third resistor 450 and a fourth resistor 460, which may correspond to resistor 330, described above.

Resistors 330 in first half-bridge 410 may have first magnetic reference directions, with first resistor 430 and second resistor 440 having opposite (e.g., anti-parallel) magnetic reference directions as shown. Resistors 330 in second half-bridge 420 have second magnetic reference directions, with third resistor 450 and fourth resistor 460 having opposite (e.g., anti-parallel) reference directions. The first magnetic reference directions and the second magnetic reference directions may be substantially perpendicular (e.g., within a tolerance threshold), in some implementations. In other words, first half-bridge 410 (of bridge 310) may generate a sine-related signal, such as a sine or a phase-inverted sine signal (e.g., as the output voltage of first half-bridge 410), and second half-bridge 420 (of bridge 310) may generate a cosine-related signal, such as a cosine or phase-inverted cosine signal (e.g., as the output voltage of second half-bridge 420).

In some implementations, bridge 310 may include four resistors 330, and each resistor may have a different magnetic reference direction. For example, resistors 330 on a same half-bridge 320 may have substantially opposite magnetic reference directions (e.g., substantially parallel magnetic reference directions, within a tolerance threshold, but pointing in opposite directions). Additionally, or alternatively, resistors 330 on different half-bridges may have substantially perpendicular magnetic reference directions.

As shown in FIG. 4A, in some implementations, bridge 310 may include a first half-bridge 410 generating a sine signal as the output voltage (shown as sin), and may include a second half-bridge 420 generating a phase-inverted cosine signal as the output voltage (shown as $\overline{\cos}$). In this arrangement, resistors 430 and 440, included in first half-bridge 410 generating the sine signal, may have substantially opposite (e.g., anti-parallel) magnetic reference directions. Further, resistors 450 and 460, included in second half-bridge 420 generating the phase-inverted cosine signal, may have substantially opposite magnetic reference directions. Further, resistors 430 and 440 may have substantially perpendicular magnetic reference directions as compared to resistors 450 and 460.

Figure 4B:
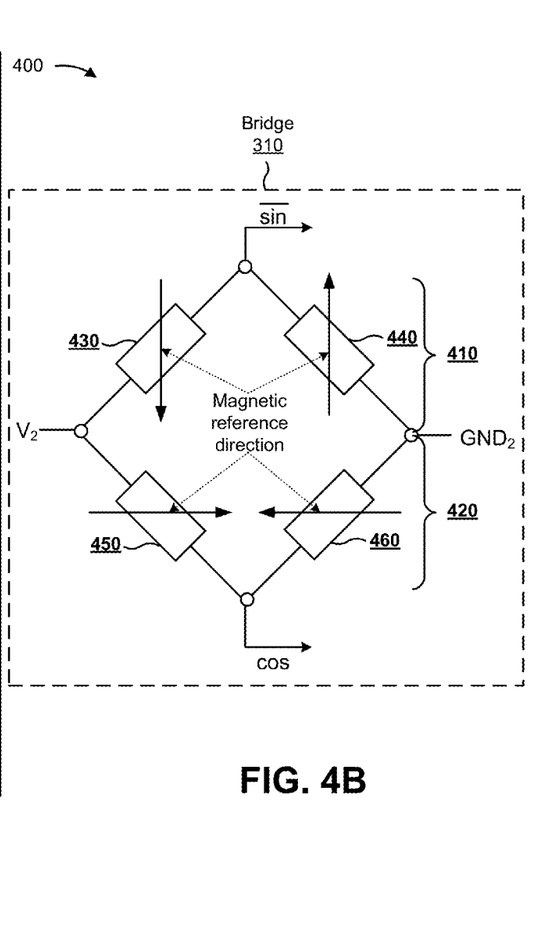

As shown in FIG. 4B, in some implementations, bridge 310 may include a first half-bridge 410 generating a phase-inverted sine signal as the output voltage (shown as $\overline{\sin}$), and may include a second half-bridge 420 generating a cosine signal as the output voltage (shown as cos). In this arrangement, resistors 430 and 440, included in first half-bridge 410 generating the phase-inverted sine signal, may have substantially opposite (e.g., anti-parallel) magnetic reference directions. Further, resistors 450 and 460, included in second half-bridge 420 generating the cosine signal, may have substantially opposite magnetic reference directions. Further, resistors 430 and 440 may have substantially perpendicular magnetic reference directions as compared to resistors 450 and 460.

Figure 4C:
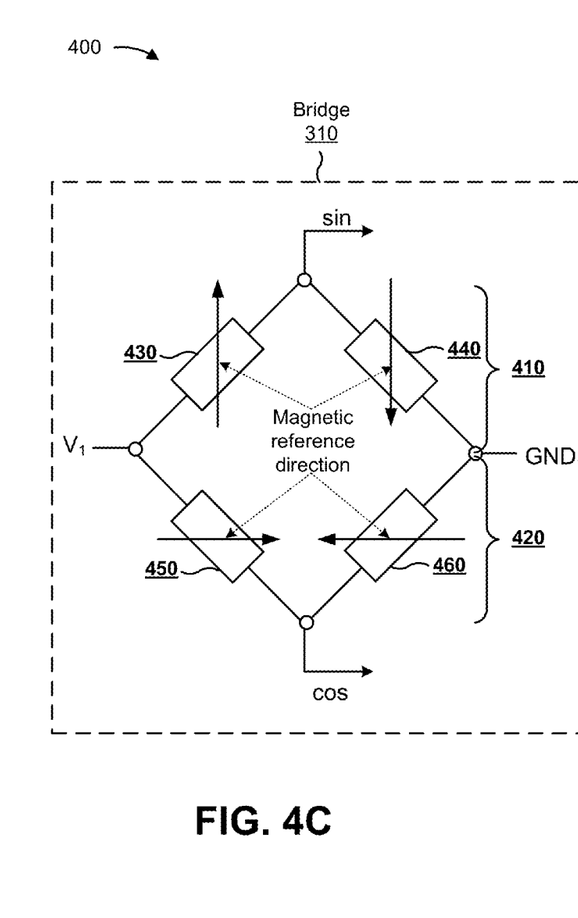

As shown in FIG. 4C, in some implementations, bridge 310 may include a first half-bridge 410 generating a sine signal as the output voltage (shown as sin), and may include a second half-bridge 420 generating a cosine signal as the output voltage (shown as cos). In this arrangement, resistors 430 and 440, included in first half-bridge 410 generating the sine signal, may have substantially opposite (e.g., anti-parallel) magnetic reference directions. Further, resistors 450 and 460, included in second half-bridge 420 generating the cosine signal, may have substantially opposite magnetic reference directions. Further, resistors 430 and 440 may have substantially perpendicular magnetic reference directions as compared to resistors 450 and 460.

Figure 4D:
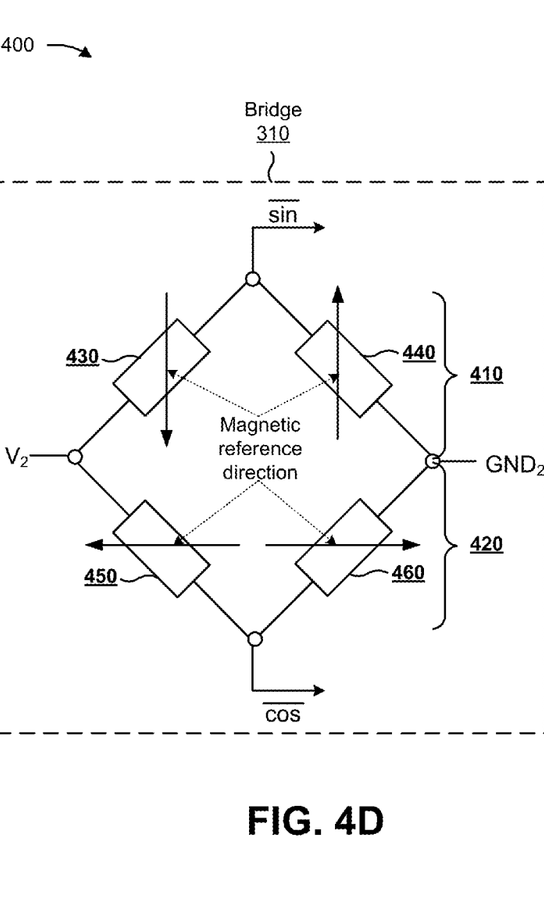

As shown in FIG. 4D, in some implementations, bridge 310 may include a first half-bridge 410 generating a phase-inverted sine signal as the output voltage (shown as $\overline{\sin}$), and may include a second half-bridge 420 generating a phase-inverted cosine signal as the output voltage (shown as $\overline{\cos}$). In this arrangement, resistors 430 and 440, included in first half-bridge 410 generating the phase-inverted sine signal, may have substantially opposite (e.g., anti-parallel) magnetic reference directions. Further, resistors 450 and 460, included in second half-bridge 420 generating the phase-inverted cosine signal, may have substantially opposite magnetic reference directions. Further, resistors 430 and 440 may have substantially perpendicular magnetic reference directions as compared to resistors 450 and 460.

Angle sensor 220 may use a sine signal (or a phase-inverted sine signal) and a cosine signal (or a phase-inverted cosine signal) to determine a direction of a magnetic field applied to angle sensor 220. When a single bridge 310 includes a first half-bridge 410 generating a sine signal (or a phase-inverted sine signal) and a second half-bridge 420 generating a cosine signal (or a phase-inverted cosine signal), the single bridge 310 may be used to determine the direction of the magnetic field. In fact, such a bridge is a mixed bridge generating a cosine-related signal and a sine-related signal within the mixed bridge, as explained further above.

In some implementations, two or more bridges 310 shown in FIGS. 4A through 4D may be included in angle sensor 220 (e.g., see FIGS. 2A and 2B). For example, angle sensor 220 may include bridge 310 shown in FIG. 4A and bridge 310 shown in FIG. 4B. As another example, angle sensor 220 may include bridge 310 shown in FIG. 4C and bridge 310 shown in FIG. 4D. As another example, angle sensor 220 may include two bridges 310 shown in FIG. 4A. As another example, angle sensor 220 may include two bridges 310 shown in FIG. 4B. As another example, angle sensor 220 may include two bridges 310 shown in FIG. 4C. As yet another example, angle sensor 220 may include two bridges 310 shown in FIG. 4D. By including multiple mixed bridges in angle sensor 220, angle sensor 220 may still measure the direction of the magnetic field if one of the mixed bridges fails.

When angle sensor 220 includes multiple bridges 310, different bridges 310 may receive power from different power supplies, in some implementations. For example, a first bridge 310 may be coupled to a first power supply, and may receive a first input voltage signal (e.g., shown as $V_1$ in FIG. 4A and FIG. 4C). In this case, a second bridge 310 may be coupled to a second power supply, and may receive a second input voltage signal (e.g., shown as $V_2$ in FIG. 4B and FIG. 4D). Further, the first bridge 310 may receive a first reference voltage signal (e.g., a first ground voltage signal, shown as $GND_1$ in FIG. 4A and FIG. 4C), and the second bridge 310 may receive a second reference voltage signal (e.g., a second ground voltage signal, shown as $GND_2$ in FIG. 4B and FIG. 4D). By providing power to different bridges 310 using different power supplies, angle sensor 220 may still be capable of measuring the direction of the magnetic field if one of the power supplies fails. It is to be noted, however, that for the remaining bridge to be operable for angle determination without a bridge with a non-functional power supply, the remaining bridge is preferably a mixed bridge as provided above.

In some implementations, angle sensor 220 may include four half-bridges 320 (e.g., in two bridges 310). A first half-bridge 320 may generate a sine signal, a second half-bridge 320 may generate a cosine signal, a third half-bridge 320 may generate a phase-inverted sine signal, and a fourth half-bridge 320 may generate a phase-inverted cosine signal. By generating these four types of signals, angle sensor 220 may increase an accuracy of a measurement of the direction of the applied magnetic field by using more signals to determine the direction.

In some implementations, a first half-bridge 320 of bridge 310 may generate a first signal indicative of a first angular component of a direction of a magnetic field (e.g., a horizontal direction, an x direction, etc.), and a second half-bridge 320 of bridge 310 may generate a second signal indicative of a second angular component of a direction of the magnetic field (e.g., a vertical direction, a y direction, etc.). The first angular component and the second angular component may be linearly independent (e.g., one angular component cannot be represented as a linear combination of the other angular component).

The number and arrangement of components and magnetic reference directions shown in FIGS. 4A-4D are provided as examples. In practice, sensing component 300 may include additional components, fewer components, different components, or differently arranged components than those shown in FIGS. 4A-4D. Additionally, or alternatively, resistors 330 may have different magnetic reference directions than those shown in FIGS. 4A-4D. Additionally, or alternatively, a set of components (e.g., one or more components) of sensing component 300 may perform one or more functions described as being performed by another set of components of sensing component 300.

Figure 5A:
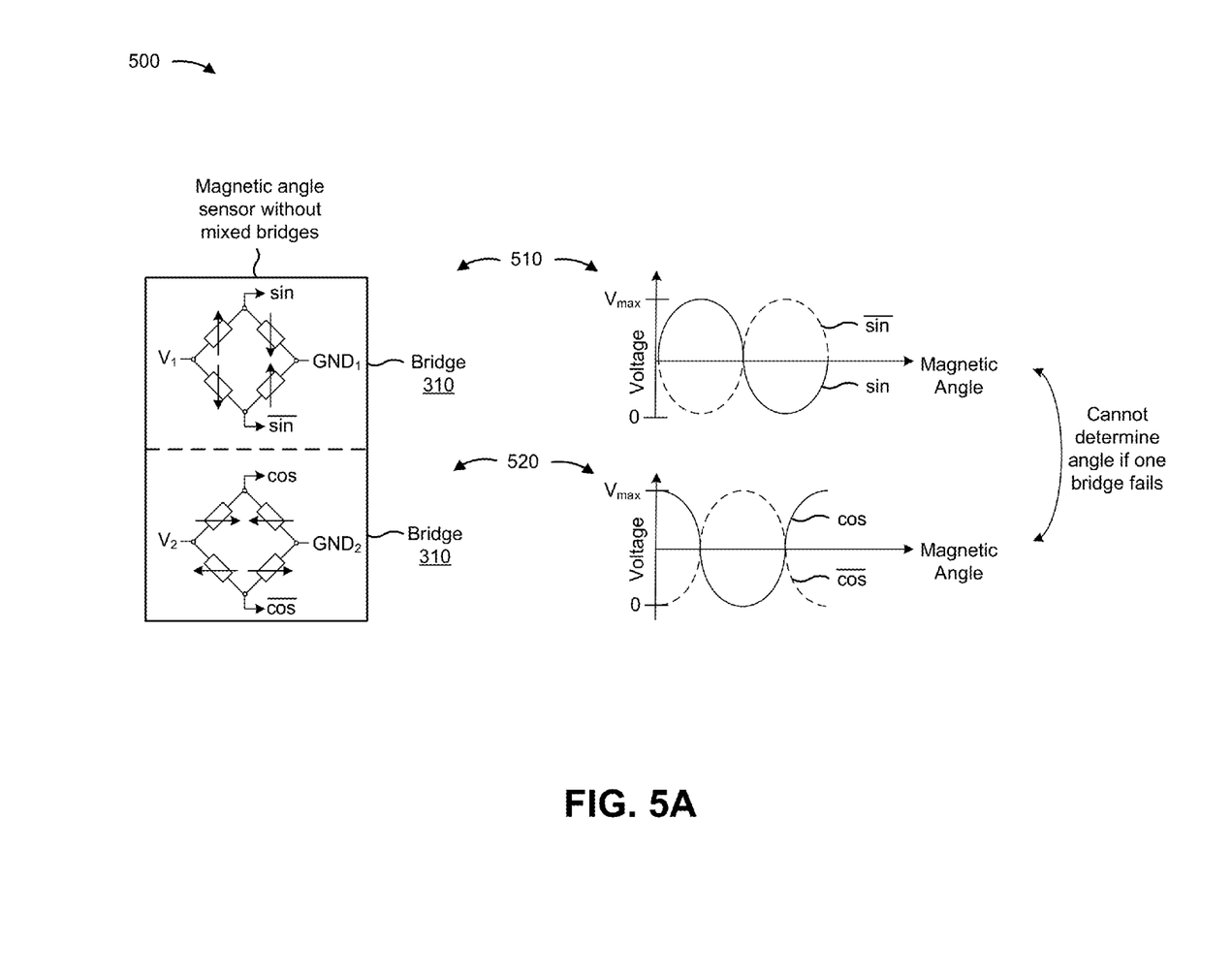
FIGS. 5A and 5B are diagrams of example implementations of an angle sensor without mixed bridges and an angle sensor with mixed bridges.
Figure 5B:
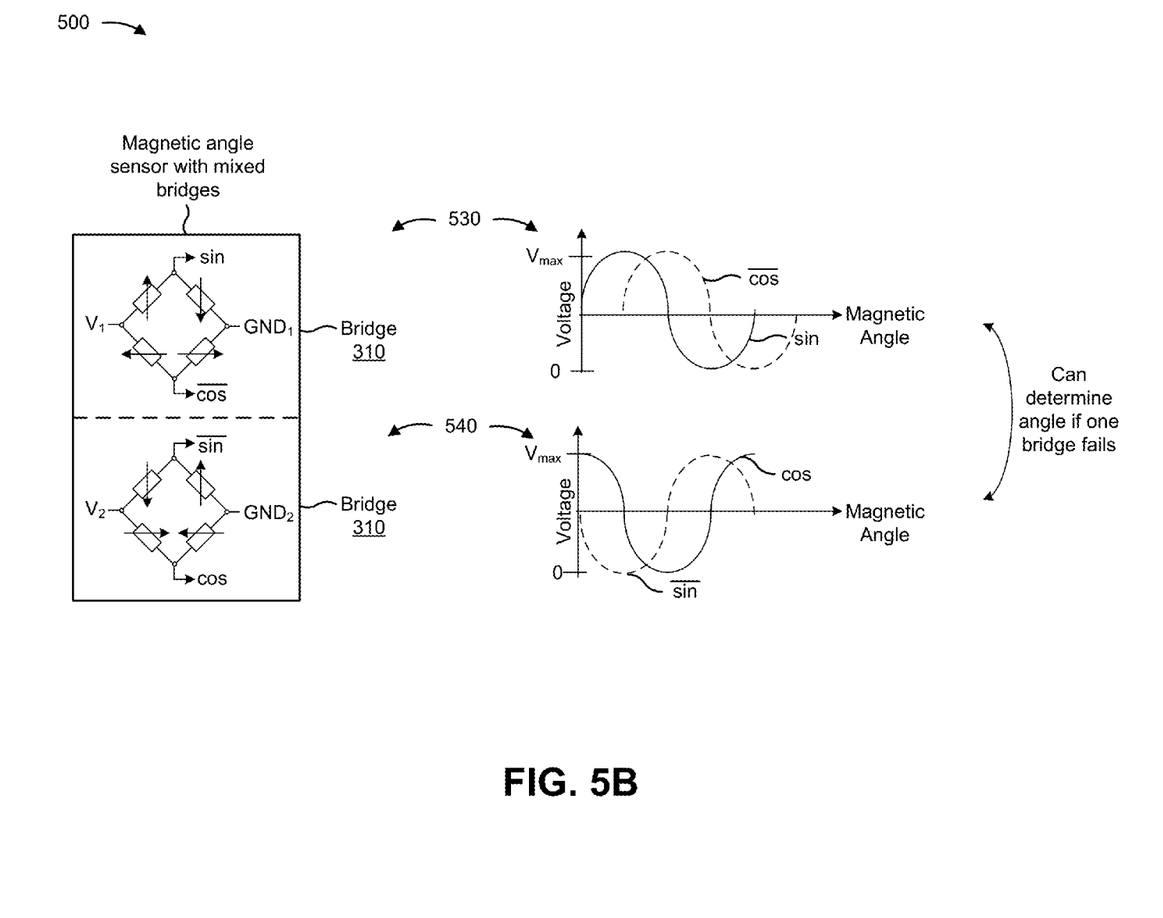

FIGS. 5A and 5B are diagrams of example implementations 500 of angle sensor 220 without mixed bridges and angle sensor 220 with mixed bridges. FIG. 5A shows an angle sensor 220 without mixed bridges, and FIG. 5B shows an angle sensor with mixed bridges.

As shown in FIG. 5A, and by reference number 510, a first bridge 310 of angle sensor 220 without mixed bridges may generate a sine signal and a phase-inverted sine signal. As shown by reference number 520, a second bridge 310 of angle sensor 220 without mixed bridges may generate a cosine signal and a phase-inverted cosine signal. Angle sensor 220 may use both a sine signal (or a phase-inverted sine signal) and a cosine signal (or a phase-inverted cosine signal) to calculate the magnetic angle of a magnetic field being applied to angle sensor 220 (e.g., a direction of the applied magnetic field with respect to a reference direction). Thus, when angle sensor 220 only generates a sine signal (and/or a phase-inverted sine signal), angle sensor 220 may not be able to calculate the magnetic angle. Likewise, when angle sensor 220 only generates a cosine signal (and/or a phase-inverted cosine signal), angle sensor 220 will not be able to calculate the magnetic angle of the applied magnetic field.

In the arrangement where the first bridge 310 of angle sensor 220 generates a sine signal and a phase-inverted sine signal and the second bridge 310 generates a cosine signal and a phase-inverted sine signal, if either the first bridge 310 or the second bridge 310 fails, angle sensor 220 will not be able to calculate the magnetic angle, since both a sine signal (or a phase-inverted sine signal) and a cosine signal (or a phase-inverted cosine signal) are needed to calculate the magnetic angle of the applied magnetic field.

As shown in FIG. 5B, and by reference number 530, a first bridge 310 of angle sensor 220 with mixed bridges may generate a sine signal and a phase-inverted cosine signal. As shown by reference number 540, a second bridge 310 of angle sensor 220 with mixed bridges may generate a cosine signal and a phase-inverted sine signal. In this arrangement, if either the first bridge 310 or the second bridge 310 fails, angle sensor 220 will still be able to calculate the magnetic angle of the applied magnetic field, since both a sine signal (or a phase-inverted sine signal) and a cosine signal (or a phase-inverted cosine signal) will still be measured by a single bridge 310 of angle sensor 220. Thus, an angle sensor 220 with mixed bridges provides improved redundancy in the case of a bridge failure. As mentioned above, signal strength in terms of SNR (signal to noise ratio) may deteriorate when changing from two operable mixed bridges to a single operable mixed bridge, however, depending on application and circumstances, maintaining operability of the sensor may be more important than signal quality, such as SNR.

By using an angle sensor comprising two bridges, where each of the bridges is a mixed bridge, angle sensor 220 may achieve increased reliability over an angle sensor with two non-mixed bridges (e.g., as shown in FIG. 1A). A non-mixed bridge only provides sin-related signals or cosine-related signals in the form of differential signals, thereby increasing SNR. However, as a trade-off for determination of the angle, one fully functional non-mixed sine bridge and one fully functional non-mixed cosine bridge are required in order to derive the angle from the arctangent of sine or cosine. However, if one of the non-mixed bridges fails, for example the cosine bridge, it becomes impossible to determine the angle of the magnetic field, as there is no cosine signal to use for the arctangent calculation. Thus, in order to achieve redundancy with non-mixed bridges, the system would require two sine bridges and two cosine bridges, which would add cost to the overall system.

For an angle sensor with two mixed bridges (e.g., as shown in FIGS. 4A-4D), should one of the bridges fail, the other bridge is still capable of providing both a sin-related signal and a cosine-related signal (e.g., despite reduced SNR). Therefore, an angle determination is still possible even if at a somewhat reduced SNR. Depending on circumstances, system design may prefer redundancy to signal degradation, such as when a loss in operability is impermissible. For example, for a steering angle system, it may be preferable for the steering angle to be determined, even with a loss in signal quality.

As indicated above, FIGS. 5A and 5B are provided merely as examples. Other examples are possible and may differ from what was described with regard to FIGS. 5A and 5B.

Figure 6:
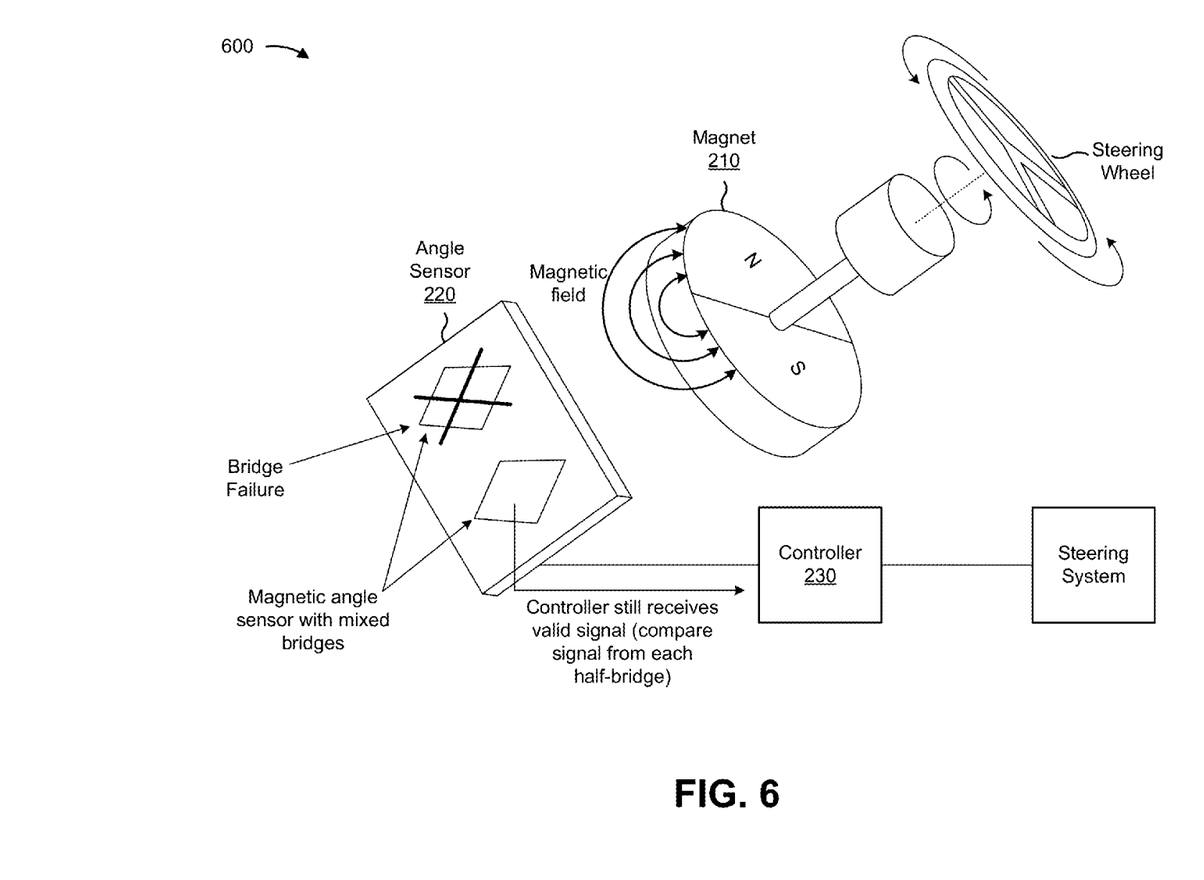
FIG. 6 is a diagram of an example implementation of an angle sensor with mixed bridges.

FIG. 6 is a diagram of an example implementation 600 of angle sensor 220 with mixed bridges. In example implementation 600, assume that angle sensor 220 is used as part of an electric power steering system.

As shown in FIG. 6, assume that as a steering wheel rotates (e.g., as the steering wheel is turned by a driver or an automated steering system), a magnet 210 attached to the steering wheel also rotates. As further shown, assume that magnet 210 generates a magnetic field. Assume that angle sensor 220, with mixed bridges, detects a magnetic direction (e.g., an angle) of the magnetic field, as shown. Further, assume that a bridge 310 of angle sensor 220 fails. In this case, and as shown, controller 230 still receives a valid signal from angle sensor 220 (e.g., from the other bridge 310), since a single bridge 310 generates both the sine signal (or a phase-inverted sine signal) and the cosine signal (or a phase-inverted cosine signal) to measure the magnetic angle of the magnetic field. In this case, controller 230 is still capable of using the signal from angle sensor 220 to control a steering system. In this way, angle sensor 220 with mixed bridges improves the safety and operability of the steering system.

In some implementations, angle sensor 220 may report a fail state (e.g., to controller 230) when a bridge 310 fails. Additionally, or alternatively, controller 230 may determine that angle sensor 220 has experienced a failure (e.g., when an output signal from a bridge 310 is not received by controller 230). In this case, controller 230 may continue to control the steering system (e.g., using an output signal from another bridge 310). Additionally, or alternatively, controller 230 may report the failure (e.g., via an output component), so that the failure may be logged and/or fixed.

As indicated above, FIG. 6 is provided merely as an example. Other examples are possible and may differ from what was described with regard to FIG. 6. For example, angle sensor 220 may be used in applications other than electric power steering.

Implementations described herein permit a single magnetic angle sensor to provide redundancy for a control system by using mixed bridges with separate power supplies, thereby increasing the safety and operability of the control system.

The foregoing disclosure provides illustration and description, but is not intended to be exhaustive or to limit the implementations to the precise form disclosed. Modifications and variations are possible in light of the above disclosure or may be acquired from practice of the implementations.

Some implementations are described herein in connection with thresholds. As used herein, satisfying a threshold may refer to a value being greater than the threshold, more than the threshold, higher than the threshold, greater than or equal to the threshold, less than the threshold, fewer than the threshold, lower than the threshold, less than or equal to the threshold, equal to the threshold, etc.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items, and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A magnetic angle sensor, comprising:
 a first bridge circuit that includes:
  a first half-bridge to generate a first signal indicative of a first angular component of a direction of a magnetic field; and
  a second half-bridge to generate a second signal indicative of a second angular component of the direction of the magnetic field,
   the second angular component being linearly independent from the first angular component,
   the first bridge circuit to receive power from a first power supply; and
 a second bridge circuit to receive power from a second power supply that is different from the first power supply,
  the first bridge circuit being operable to permit the direction of the magnetic field to be determined based on the first signal and the second signal and without a signal generated by the second bridge circuit, and
  the second bridge circuit being operable to permit the direction of the magnetic field to be determined based on a signal generated by the second bridge circuit and without the first signal or the second signal generated by the first bridge circuit.

2. The magnetic angle sensor of claim 1, wherein the first angular component corresponds to a cosine-related component, and wherein the second angular component is substantially orthogonal to the first angular component.

3. The magnetic angle sensor of claim 1, wherein the first bridge circuit and the second bridge circuit are formed on one chip.

4. A magnetic angle sensor, comprising:
a first bridge circuit that includes:
a first half-bridge and a second half-bridge,
the first half-bridge providing a first signal indicative of a first angular component of a direction of a magnetic field,
the second half-bridge providing a second signal indicative of a second angular component of the direction of the magnetic field,
the first bridge circuit to receive power from a first power supply; and
a second bridge circuit that includes:
a third half-bridge and a fourth half-bridge, wherein the third half-bridge provides a signal indicative of a second angular component anti-parallel to the first angular component,
the second bridge circuit to receive power from a second power supply that is different from the first power supply,
the first bridge circuit being operable to permit the direction of the magnetic field to be determined based on the first signal and the second signal and without a signal generated by the second bridge circuit, and
the second bridge circuit being operable to permit the direction of the magnetic field to be determined based on a signal generated by the second bridge circuit and without the first signal or the second signal generated by the first bridge circuit.

5. The magnetic angle sensor of claim 4, wherein the first bridge circuit and the second bridge circuit are formed on one chip.

6. The magnetic angle sensor of claim 4, wherein the first half-bridge comprises:
a first resistor and a second resistor,
the first resistor and the second resistor having opposite first magnetic reference directions; and
wherein the second half-bridge comprises:
a third resistor and a fourth resistor,
the third resistor and the fourth resistor having opposite second magnetic reference directions that are substantially perpendicular to the first magnetic reference directions.

7. The magnetic angle sensor of claim 6, wherein the third half-bridge comprises:
a fifth resistor and a sixth resistor,
the fifth resistor and the sixth resistor having opposite third magnetic reference directions; and
wherein the fourth half-bridge comprises:
a seventh resistor and an eighth resistor,
the seventh resistor and the eighth resistor having opposite fourth magnetic reference directions that are substantially perpendicular to the third magnetic reference directions.

8. The magnetic angle sensor of claim 4, wherein the first half-bridge is configured to generate a sine-related signal; and
wherein the second half-bridge is configured to generate a cosine-related signal.

9. A sensing component, comprising:
a first bridge circuit that includes:
a first half-bridge that includes:
a first magnetoresistor having a first magnetic reference direction; and
a second magnetoresistor having a second magnetic reference direction,
the second magnetic reference direction being different from the first magnetic reference direction,
the first half-bridge to generate a first signal;
a second half-bridge that includes:
a third magnetoresistor having a third magnetic reference direction,
the third magnetic reference direction being different from the first magnetic reference direction and the second magnetic reference direction; and
a fourth magnetoresistor having a fourth magnetic reference direction,
the fourth magnetic reference direction being different from the first magnetic reference direction, the second magnetic reference direction, and the third magnetic reference direction,
the second half-bridge to generate a second signal,
the first bridge circuit to receive power from a first power supply; and
a second bridge circuit to receive power from a second power supply that is different from the first power supply,
the first bridge circuit being operable to permit a direction of an external magnetic field to be determined based on the first signal and the second signal and without a signal generated by the second bridge circuit, and
the second bridge circuit being operable to permit the direction of the external magnetic field to be determined based on a signal generated by the second bridge circuit and without the first signal or the second signal generated by the first bridge circuit.

10. The sensing component of claim 9, wherein the first magnetic reference direction is substantially perpendicular to the third magnetic reference direction and the fourth magnetic reference direction.

11. The sensing component of claim 10, wherein the second magnetic reference direction is substantially perpendicular to the third magnetic reference direction and the fourth magnetic reference direction.

12. The sensing component of claim 9, wherein the first signal is a sine signal or a phase-inverted sine signal; and
wherein the second half bridge signal is a cosine signal or a phase-inverted cosine signal.

13. The sensing component of claim 9, wherein the sensing component is included in a magnetic angle sensor.

14. The sensing component of claim 9, wherein the first signal is a sine signal; and
wherein the second signal is a cosine signal.

15. The sensing component of claim 9, wherein the first signal is a sine signal; and
wherein the second signal is a phase-inverted cosine signal.

16. The sensing component of claim 9, wherein the first signal is a phase-inverted sine signal; and
wherein the second signal is a cosine signal.

17. The sensing component of claim 9, wherein the first signal is a phase-inverted sine signal; and wherein the second signal is a phase-inverted cosine signal.

18. An apparatus, comprising:
a first bridge circuit configured to receive power from a first power supply, the first bridge circuit comprising:
a first half-bridge that includes a first resistor and a second resistor having a first magnetic reference direction and a second magnetic reference direction, respectively,
the first half-bridge to generate a first output signal; and
a second half-bridge that includes a third resistor and a fourth resistor having a third magnetic reference direction and a fourth magnetic reference direction, respectively, that are substantially perpendicular to the first magnetic reference direction and the second magnetic reference direction,
the second half-bridge to generate a second output signal; and
a second bridge circuit configured to receive power from a second power supply that is different from the first power supply,
the second bridge circuit comprising:
a third half-bridge that includes a fifth resistor and a sixth resistor having a fifth magnetic reference direction and a sixth magnetic reference direction, respectively; and
a fourth half-bridge that includes a seventh resistor and an eighth resistor having a seventh magnetic reference direction and an eighth magnetic reference direction, respectively, that are substantially perpendicular to the fifth magnetic reference direction and the sixth magnetic reference direction,
the first bridge circuit being operable to permit a direction of a magnetic field to be determined based on the first output signal and the second output signal and without an output signal generated by the second bridge circuit, and
the second bridge circuit being operable to permit a direction of the magnetic field to be determined based on an output signal generated by the second bridge circuit and without the first output signal or the second output signal generated by the first bridge circuit.

19. The apparatus of claim 18, wherein a first pair of anti-parallel magnetic reference directions is formed by at least two of:
the second magnetic reference direction,
the fourth magnetic reference direction,
the sixth magnetic reference direction, or
the eighth magnetic reference direction; and
wherein a second pair of anti-parallel magnetic reference directions, being substantially perpendicular to the first pair of anti-parallel magnetic reference directions, is formed by at least two others of:
the second magnetic reference direction,
the fourth magnetic reference direction,
the sixth magnetic reference direction, or
the eighth magnetic reference direction.

20. The apparatus of claim 18, wherein,
the first output signal including a sine signal or a phase-inverted sine signal; and
the second output signal being a cosine signal or a phase-inverted cosine signal.

* * * * *

UNITED STATES PATENT AND TRADEMARK OFFICE
CERTIFICATE OF CORRECTION

PATENT NO. : 9,625,281 B2
APPLICATION NO. : 14/580862
DATED : April 18, 2017
INVENTOR(S) : Christoph Bilger et al.

It is certified that error appears in the above-identified patent and that said Letters Patent is hereby corrected as shown below:

Column 14, Line 52, Claim 12 change "wherein the second half bridge signal is a cosine signal" to --wherein the second signal is a cosine signal--

Signed and Sealed this
Twentieth Day of June, 2017

Joseph Matal
*Performing the Functions and Duties of the
Under Secretary of Commerce for Intellectual Property and
Director of the United States Patent and Trademark Office*